United States Patent [19]

Fanning

[11] Patent Number: 4,488,662
[45] Date of Patent: Dec. 18, 1984

[54] MAGAZINING DEVICE FOR USE WITH AUTOMATIC COMPONENT ASSEMBLING MACHINE

[75] Inventor: William J. Fanning, Glen Ellyn, Ill.

[73] Assignee: AT&T Technologies, Inc., New York, N.Y.

[21] Appl. No.: 442,822

[22] Filed: Nov. 18, 1982

[51] Int. Cl.³ .............................................. B65H 1/00
[52] U.S. Cl. .................................. 221/197; 221/262; 29/809
[58] Field of Search ........... 221/312 R, 312 B, 312 C, 221/197, 198, 262, 268, 287; 29/740, 809; 206/328, 334; 312/42, 50

[56] References Cited

U.S. PATENT DOCUMENTS

| 2,990,084 | 6/1961 | Probajco . | |
|---|---|---|---|
| 3,021,031 | 2/1962 | De Nicolo | 221/287 |
| 3,768,636 | 10/1973 | O'Connell . | |
| 4,043,485 | 8/1977 | Tippetts . | |
| 4,212,102 | 7/1980 | Drinkard . | |
| 4,222,166 | 9/1980 | Kurek et al. | 29/809 |
| 4,327,832 | 5/1982 | Matteo . | |

FOREIGN PATENT DOCUMENTS 55-153355 11/1980 Japan ................................ 206/334

Primary Examiner—H. Grant Skaggs
Attorney, Agent, or Firm—R. P. Miller; K. R. Bergum

[57] ABSTRACT

A fixture (31) is constructed of plastic for holding a stack of electrical components (10) that are to be sequentially picked off (77) from the bottom of the stack and fed to a component insertion machine. The fixture includes a receiver (32) having a passageway (47) into which projects shoulder(s) 68 for supporting a tube (14) of components. The components are held in the tube, during loading and unloading by a stylus-like tool (30) which fits within a tube slot (26). The tool is used to support and guide the components during movement of the components through the receiver passageway onto or from a removable support tab (57) without spillage or jamming of the components in the passageway.

4 Claims, 10 Drawing Figures

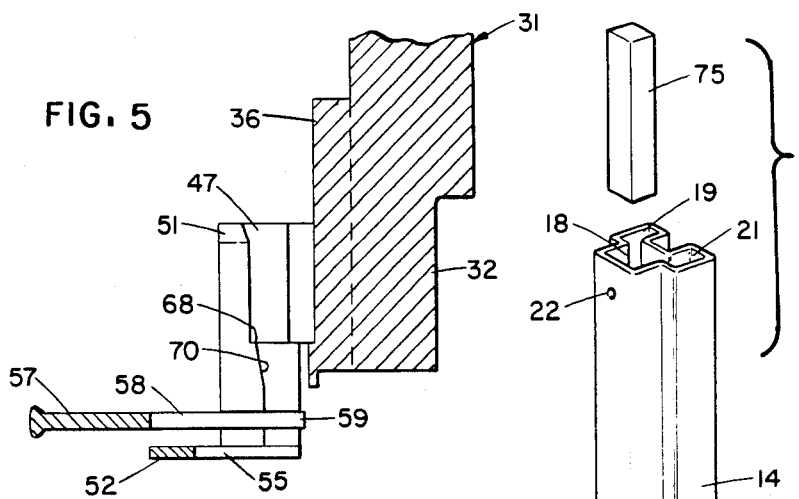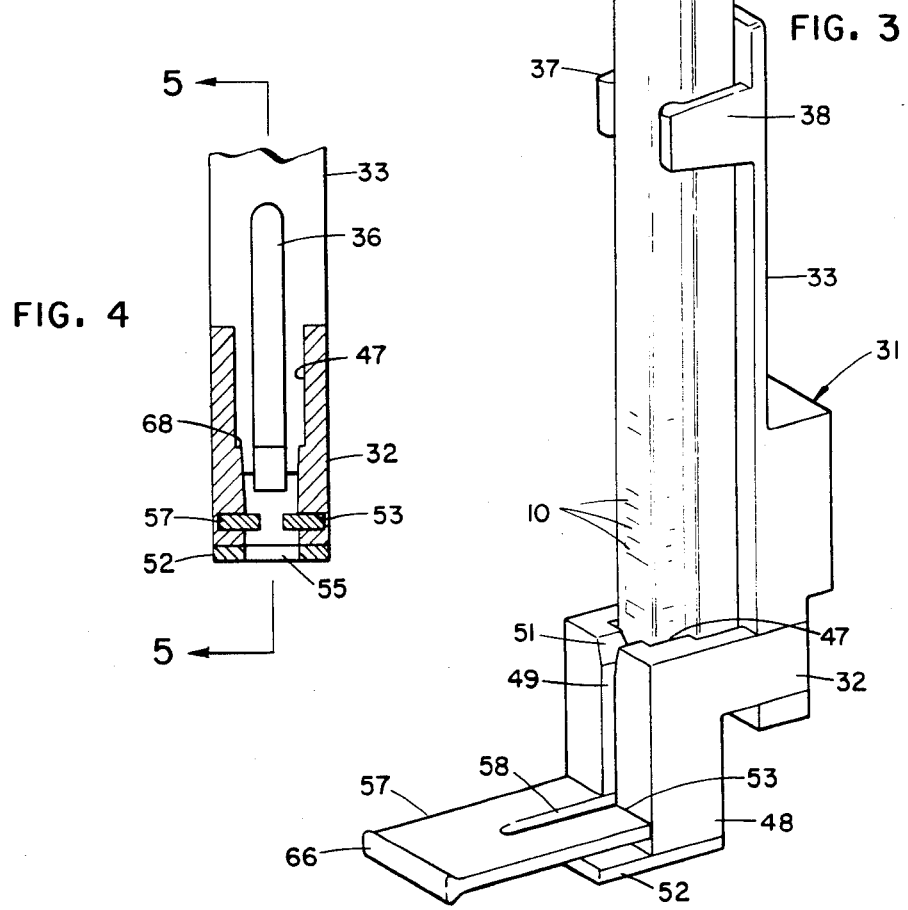

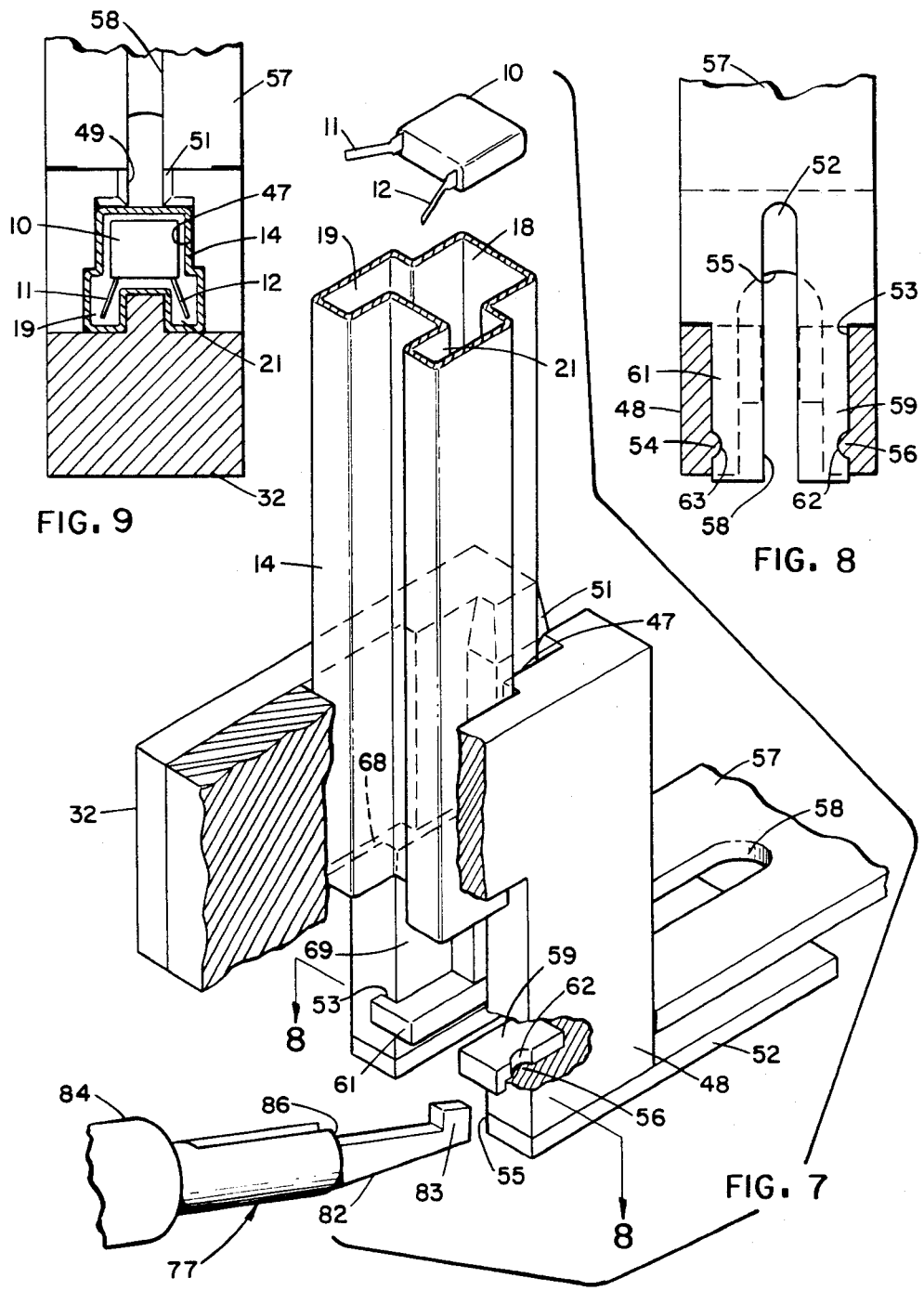

MAGAZINING DEVICE FOR USE WITH AUTOMATIC COMPONENT ASSEMBLING MACHINE

FIELD OF THE INVENTION

This invention relates to a stacking device for electrical components that are to be transported to and assembled on a printed circuit board and, more particularly, to a component stacking device that is constructed of molded plastic parts which can be easily loaded and unloaded without spilling the components.

BACKGROUND OF THE INVENTION

There are many automatic electrical component assembly machines wherein the components are advanced from a magazining device to an assembly apparatus which functions to place the components at selected locations in or on an electrical unit, such as a printed circuit board or substrate. One such machine is manufactured by the Universal Instruments Company of Binghamton, N.Y. and sold under the designation Model 6794 component insertion machine. In automatic assembly machines of this type, components to be assembled are loaded in plastic magazine tubes having cross-sectional configurations conforming to the outline of the components to be assembled.

One of the difficulties in the use of such magazining devices resides in the loading and unloading of the magazine tubes without spilling the components. More particularly, the loading of a magazine tube is usually accomplished by horizontally placing the tube in the magazining device and then pivoting the tube to a vertical position where the stack of components drop through a passageway formed in a receiver so that the lower-most component is held in position to be extracted by a feed device for transport to the automatic assembly facilities. Considerable time and care must be used to effectuate such a loading operation without spilling the components. A further problem exists when it is desired to remove the magazine tube prior to the exhaustion of the stack of components in the tube. This removal operation is time consuming and again considerable care must be exercised to avoid excessive spillage of the components in the magazine tube.

SUMMARY OF THE INVENTION

This invention contemplates, among other things, a magazining fixture constructed of plastic material which may be rapidly loaded and unloaded with plastic magazine tubes holding stacks of components without spilling the components.

More particularly, a magazine fixture is provided with a receiver block having a vertical passageway into which project shoulders or lips for retaining a magazine tube loaded with components. The magazine tube is formed with a vertical slot running from one end thereof into which may be placed a stylus tool for retaining the components in the tube when the tube is turned upside down and loaded into the fixture.

The receiver block is formed with a vertical slot for accommodating the tool while the tube is loaded into the fixture. A slidable support tab extends through the fixture into the lower portion of the receiver passageway and acts to hold the stack of components when the stylus tool is moved down the vertical slot to lower the stack onto the support tab. The tool may be then removed leaving the component stack supported on the tab with the lowermost component positioned to be extracted and transported to an automatic component assembly machine.

When the stack of components is partially exhausted and it is desired to remove the magazine tube and the remainder of the stack of components, the stylus tool is reinserted through the vertical slot and the slot in the tube to engage the underside of the lowermost component. The support tab is also slotted to accommodate the stylus tool during the unloading operation. A thumb tack is pushed through the tube so that the pointed end section overlies the component stack. With the stylus tool held in the tube slot, the tube and stylus are lifted to remove the partially filled magazine from the fixture.

DESCRIPTION OF THE DRAWINGS

Other features and advantages of the invention will be apparent upon consideration of the following detailed description when considered with the drawings, wherein:

FIG. 3 is a perspective view of the component dispensing fixture loaded with a magazine tube of the type shown in FIG. 1;

FIG. 4 is a section view taken along line 4—4 of FIG. 2 showing shoulders within the fixture for supporting the magazine tube;

FIG. 5 is a sectional view taken along line 5—5 of FIG. 4 showing a slidable tab within the fixture for supporting a stack of components;

FIG. 7 is another perspective view partially cut away to illustrate the extraction of a component from the fixture;

FIG. 8 is a sectional view taken along line 8—8 of FIG. 7 showing facilities for latching the slidable tab in position;

FIG. 9 is a top view partially in cross section of a magazine seated in the fixture.

DETAILED DESCRIPTION

Figures 1, 2:
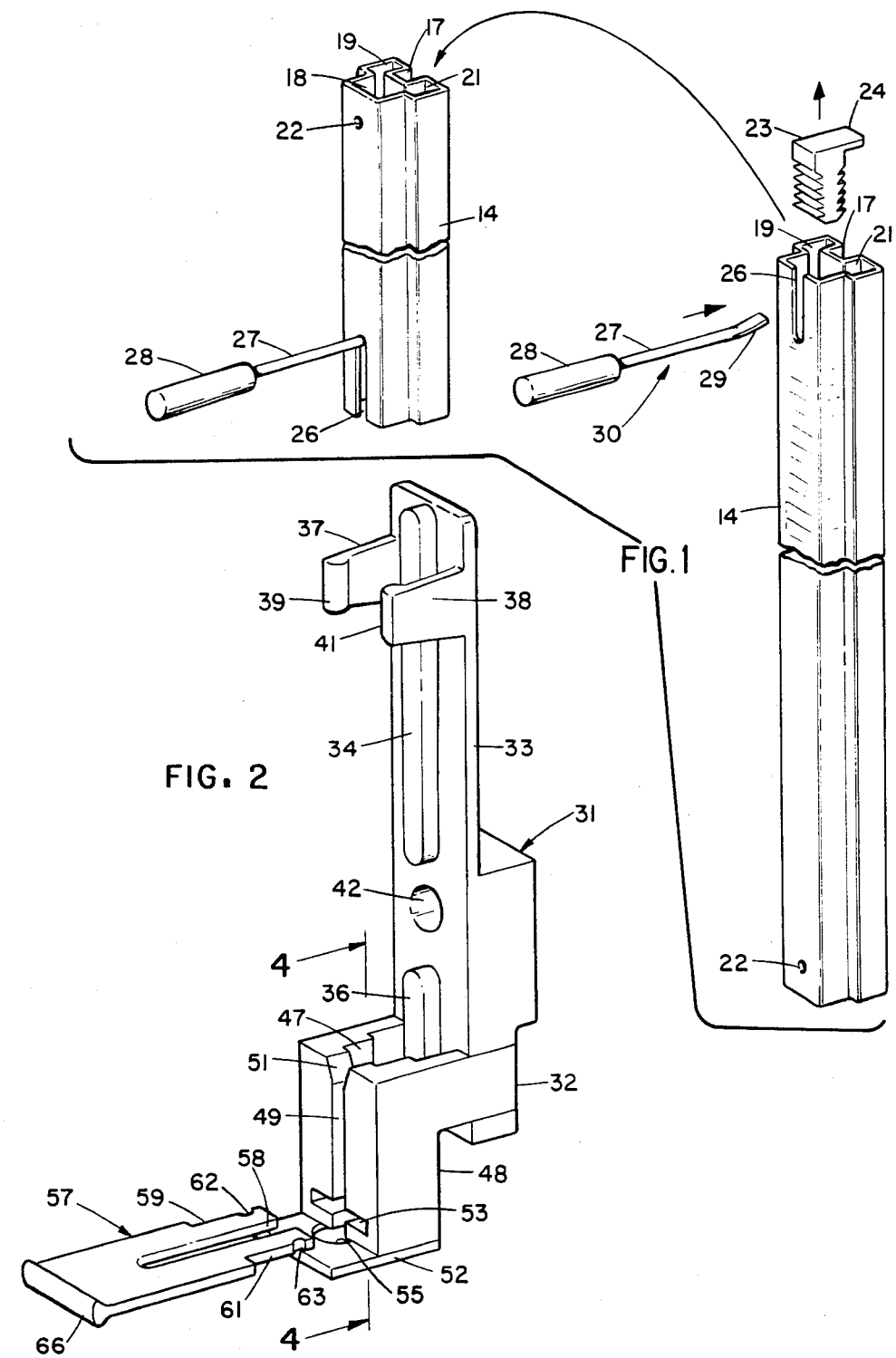
FIG. 1 is a perspective view of a magazine tube in two different vertical positions modified in accordance with the invention for holding components to be dispensed by the apparatus shown in the other figures.
FIG. 2 is a perspective view of a fixture for holding the magazine tube shown in FIG. 1.

For purposes of illustration, the invention is described in relation to the magazining and dispensing of boxed electrical capacitors of the type disclosed in copending application, Method and Apparatus for Boxing and Encapsulating Electrical Devices, Ser. No. 284 833, filed July 20, 1981 in the names of W. J. Fanning et al, now U.S. Pat. No. 4,424,617, assigned to the Western Electric Company, Incorporated. More particularly, one such component is clearly shown in FIGS. 7 and 9 and comprises a small plastic box 10 having a horizontal square shape and a rectangular height which encapsulates a rolled metallized film type capacitor with a pair of radially projecting leads 11 and 12. The leads 11 and 12 may extend in parallel relation or in a slightly outwardly diverging relation. A stack of capacitors 10 are machine or manually loaded in a magazine tube 14 (see FIG. 1) constructed of a transparent thermoplastic material which is susceptible of being penetrated with a sharp instrument, such as thumb tack 16 (see FIG. 10). The tube 14 may be extrusion formed and is provided with an indented channel 17.

The tube is shaped to provide a chamber passageway 18 to accommodate the bodies of the components and a pair of side chambers 19 and 21 to receive the leads 11 and 12. It will be noted that the cross-sectional configuration of the tube generally conforms to the outlined configuration of the component. The dimensioning of the chamber passageway 18 is selected so that the tumbling and tilting of the components is deterred during loading into and unloading from the tube. More specifically, there is a minimum tolerance, less than the thickness of the component body, between the body of a component and the inner wall of the chamber passageway 18. However, with components that are relatively thin, such as shown in the drawings, there is still a problem of tumbling and tilting so that the components may jam in the tube during dispensing of the components from the tube.

A stack of components 10 is held in the tube by a pair of oppositely disposed indentations 22 (only the front indentation is shown in the drawing) which forms a pair of protuberances that extends into the lower section of the tube. Following loading of a stack of components 10 in the tube 14, a rubber stopper 23 may be inserted in the upper end of the chamber passageway 18. The stopper is provided with a projecting lip 24 which overlies the lead accommodating chamber passageways 19 and 21. The upper end of the tube is provided with a longitudinally extending slot 26 which extends downwardly to the vicinity of the top of a normal stack of components placed in the tube. The slot 26 is wide enough to receive a shank 27 of a stylus-like tool 30 having a handle 28. The end of the tool may be provided with a flat offset section 29 to facilitate manipulation of the tool during the loading and unloading of the tube in the magazining and dispensing fixture 31 shown in the other views. When the tool 30 is pressed against the top of the stack, the components are pressed together to preclude tumbling and tilting during loading and unloading of the tube of components in the dispensing fixture 31.

The fixture 31 includes a receiver or base 32 having an upwardly extending support member 33. The fixture 31 may be constructed of metal but it is preferable to mold the fixture from a wear-resistant plastic such as glass filled polycarbonate. Formed on the face of the vertical support 33 are two vertically aligned guide ribs 34 and 36 that are shaped to conform with the channel 17 formed in the tube 14. In addition, a pair of flexible locking arms 37 and 38 project from the front face of the support member 33 for receiving the tube. The arms are provided with a pair of projecting nubs 39 and 41 which engage shoulders formed by the chambers 19 and 21 of the tube 14 when the tube is mounted in the fixture. The fixture is also provided with a transverse hole 42 for receiving a mounting bolt 43 (see FIGS. 2 and 6) which is used to secure the fixture to an automatic component insertion machine, a portion of the frame of which is disclosed in FIG. 6 and denoted by the reference numeral 44. In order to stabilize the fixture on the plate 44, the fixture is provided with a projecting dowel 45 that fits within a suitable hole formed in the frame member 44.

The receiver 32 is formed with a vertically extending passageway 47 which forms a dispensing chamber (see FIGS. 2, 3, and 7) that is shaped to have a cross section conforming to the cross section of the tube 14. The receiver 32 is provided with a dependent section 48 formed with a vertically extending slot 49 with a flared mouth 51. The lower face of the dependent section 48 has a plate 52 secured thereto. This plate is formed with a slot 55 (see FIGS. 4 and 5) having a width equal to the width of the passageway 47. In addition, the dependent section 48 is formed with a horizontal slot 53 (see FIG. 1) and as shown in FIGS. 7 and 8, the slot 53 is formed with a pair of facing protuberances 54 and 56. A tab or slide 57 is shaped to fit within the slot 53. The tab includes a longitudinally extending slot 58 which forms the tab with two flexible arms 59 and 61. Notches 62 and 63 are formed in the arms 59 and 61 and are adapted to seat on the protuberances 54 and 56 when the tab 57 is inserted in the slot 53. The rear end of the tab is enlarged to provide a finger grip 66 to facilitate inserting and removing the tab in the slot 53.

Figure 6:
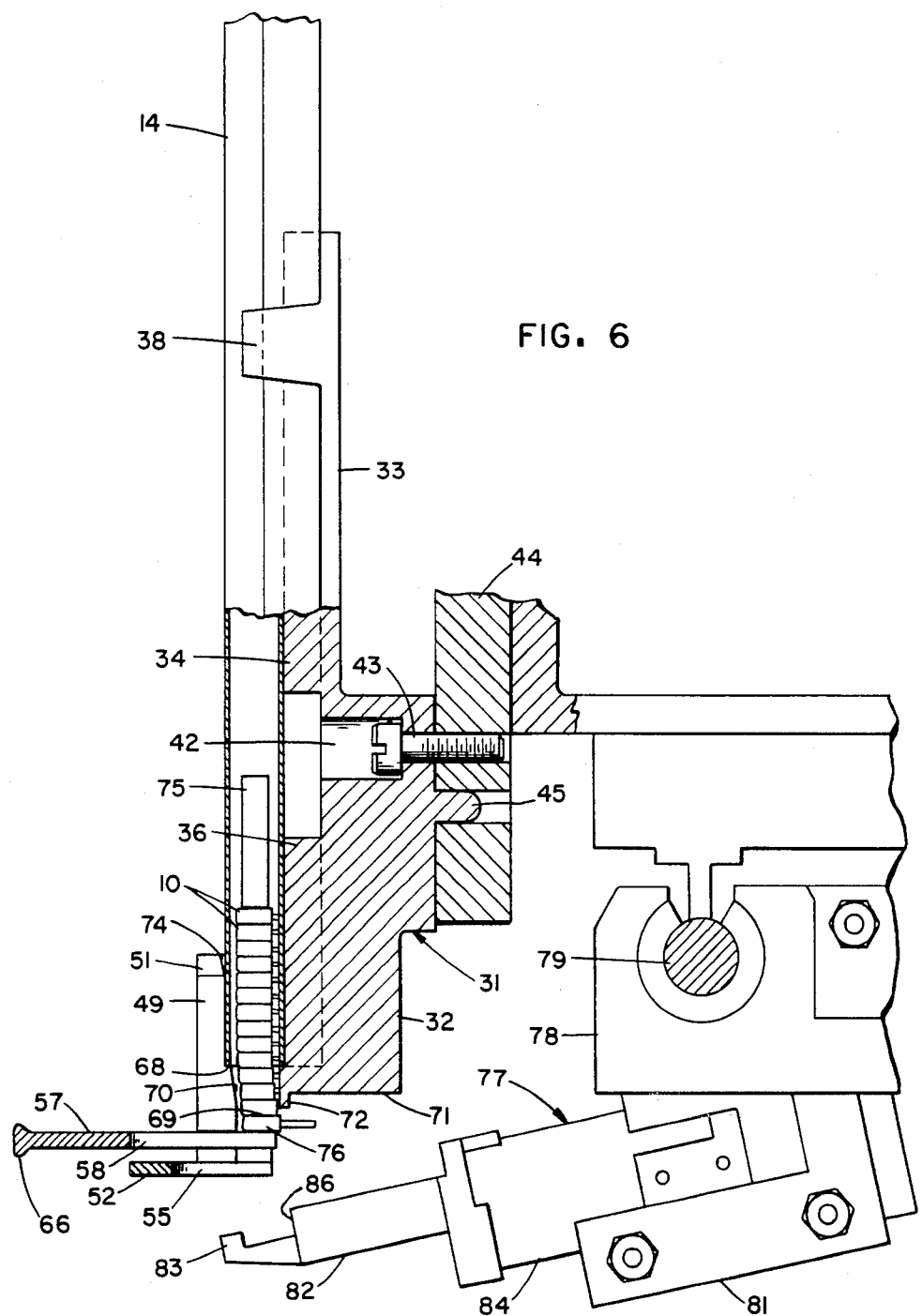
FIG. 6 is a side elevational view partially cut away of the dispensing fixture in conjunction with a component feeding device for extracting components from the fixture.

Referring to FIGS. 6 and 7, it will be observed that the passageway 47 has a thin shoulder section 68 which functions to limit tne extent of insertion of a tube 14 in the passageway. The width of the shoulder 68 is approximately equal to ⅔ of the thickness of the wall of the tube 14 so that components 10 may be dropped unimpeded past the shoulder into a dispensing section 69 of the receiver 32. The dropping of the components from the tube 14 into the dispensing chamber 47 is eased by slowly moving the stylus tool 30 downwardly through the receiver slot 49 and then through the tab slot 58 thus easing the stack into the dispensing chamber 47. It will be noted that the height of the dispensing chamber 47 is only high enough to accommodate a few, three or four, components. With the tab 57 inserted in the receiver, the tool 30 is moved downwardly and the stack of components is lowered from the end of the tube to rest on the tab. Looking at FIGS. 5 and 6, it will be observed that a forward wall 70 of a continuation of the passageway 47 is slightly tapered, so that the generally vertically aligned components at the bottom of the stack engage and ride along the tapered wall 70 to a precise position on the tab 57. It will also be noted from FIG. 4 that the lateral walls of the continuation of the passageway 47 are also slightly tapered to centrally locate the lowermost component on tab 52. The lower portion of the receiver 32 (see FIG. 6) is cut away along surface 71 that runs to a small projection 72, The projection 72 extends downwardly to leave a gap between the end of the projection and the top of the tab 57 which is slightly greater than the thickness of one component 10.

In use of the magazining fixture, a tube 14 (FIG. 1) is loaded with components 10, and the stopper 23 is placed in the upper end or the tube to confine the components during transport of the tube from the component loading station to the magazining fixture shown in FIG. 2. The stopper 23 is removed and the shank 27 of the tool 30 is placed in the slot 26 to bear against the top of the stack of components. With the stylus-like tool held in place, to apply a compressive force to hold the stack from tumbling and tilting, the tube is inverted and lowered into the fixture with the channel 17 riding over the guide ribs 34 and 36. The arms 37 and 38 are flexed slightly outward to accommodate the tube while the nubs 39 and 41 ride on the walls of the side chambers 19 and 21. During the lowering of the tube 10 into the fixture, the tool shank 27, now holding the stack of components, passes through the slot 49. The tube is lowered until the walls of the tube engage the shoulders 68 (see FIG. 6) whereafter the tool is further lowered in an angular fashion (see FIG. 10) into the slot 58 formed in the stack retaining tab 57 and the stack of components is eased onto the tab. The tool shank 27 is now withdrawn, leaving the stack of components resting on the tab. Pressure may be placed on the stack of components by loading a weight 75 (see FIG. 3) in the chamber's passageway 18 of the tube. The weight acts to compress the stack of components and prevent the upper components from jamming in response to withdrawal of the lowermost component from the stack and the dropping of the stack. The weight insures that the entire stack is eased downwardly without the upper component(s) being jiggled and jammed in the tube.

A lowermost component designated by the reference numeral 76 in FIG. 6 is positioned to be withdrawn by a pick-off device 77. This pick-off device may be of commercial manufacture such as supplied with the above-identified components machine furnished by Universal Instruments Company. Such a device may include a motor driven screw that moves shuttle 78 to ride along guide rods, one which is designated by reference numeral 79, a pivot frame 81 controlled by an air cylinder or other device (not shown), and a piston slide 82 having a pick-off hook 83 moved by an air cylinder 84.

In operation of the pick-off device 77, the shuttle 78 is moved into lateral alignment with the magazining device 31 and the frame 81 is pivoted upwardly (see FIGS. 6 & 7) to move the hook 83 through the plate slot 55 and the tab slot 58 behind the lowermost component 76. Next the air cylinder 84 is operated, to move the hook to engage and slide the lowermost component 76 against a stop surface 86. The component is now pinched and held between the hook 86 and the stop holder member 86. Thereafter, the pick-off device 77 is operated to convey the component to an assembly station where the component is loaded into an insertion device which functions to insert the component leads 11 and 12 into holes formed into a printed circuit board.

Figure 10:
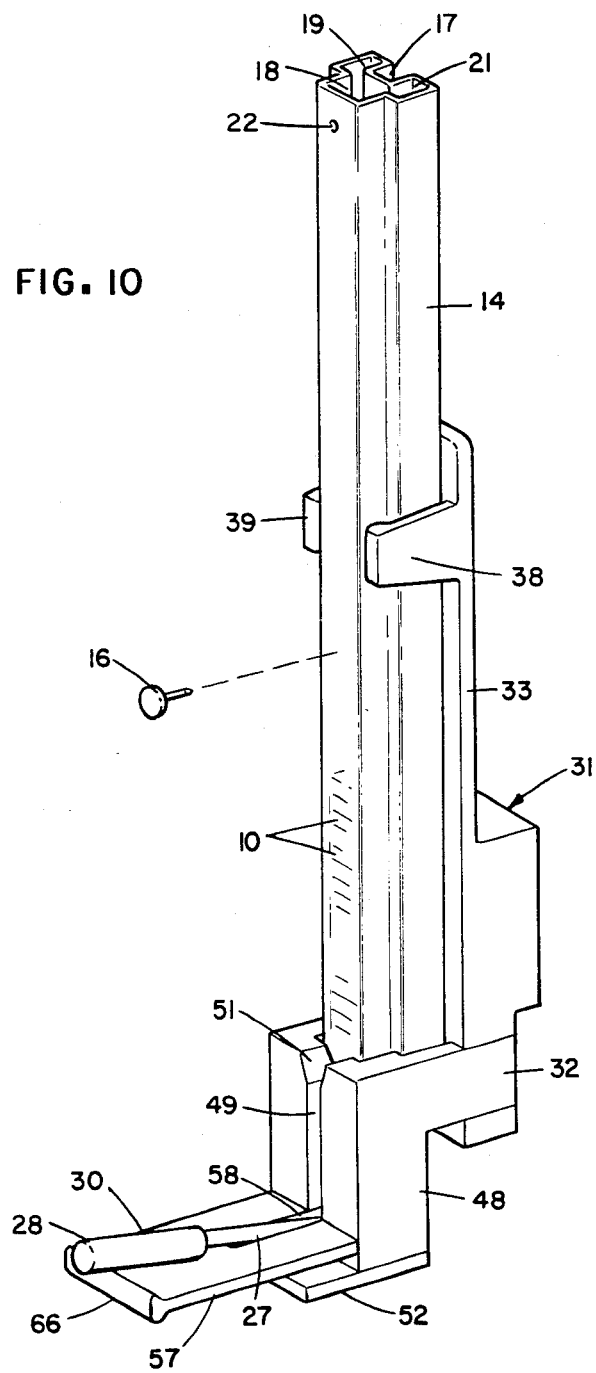
FIG. 10 is a further perspective view showing the magazine tube and the fixture together with the instrumentalities to be utilized in withdrawing the partially filled magazine tube from the fixture.

If needed, the tube of components may be removed from the stacking fixture 31 prior to exhaustion of the component stack without the danger of spilling the components. First, a thumb tack 16 (see FIG. 10) is pressed through the tube 14 so that the pointed end of the tack overlays, in a slightly spaced relation, the uppermost component in the partially dispensed stack. In the alternative a stopper can be pushed down from the top of the tube to a position slightly above the topmost component. The stylus-like tool 30 is angularly positioned as shown in FIG. 10 with the shank 27 extending through the tab slot 58 so that the flat offset section 29 underlies the lowermost component in the stack. The tool handle 28 is lifted moving the shank 27 along the slot 49 to slightly raise the stack of components into firm engagement with the thumb tack. Continued movement of the stylus-like tool causes the stack of components and the tube 14 to be lifted from the passageway 47 in the receiver 32. Now, the tube 14 may be pivoted away from the upright support 33, and the locking arms 37 and 38 will flex outwardly to permit removal of the tube from the fixture. The partially filled tube is then inverted and the stopper 23 is inserted to press against the upper component. The partially filled tube of components may then be set aside for future use.

Should a component become jammed in the receiver 32, the shank 27 of the tool 30 is inserted in the slot 49 beneath the lowermost component that is not jammed and the handle 28 lifted to raise and free the stack of components. The finger grip 66 of the tab 57 is then grasped and pulled to withdraw the tab. At that time, a second stylus-like tool or pick (not shown) may be inserted in the slot 49 or manipulated through the opposite open side of the receiver dependent section 48 to dislodge the jammed component which drops through the slot 55 in the plate 52. The tab 57 is then replaced and the tool 30 is lowered to again deposit the stack of components on the tab.

What is claimed is:

1. A fixture for receiving a stack of components to be dispensed by a component extracting member, which comprises:

a receiver block having a vertical passageway therethrough with opposed shoulders projecting into the passageway;

a magazine tube for holding a supply of components, the lower end of said tube resting on said shoulders to permit the components to drop down the passageway;

said receiver block having a horizontal slot in a front section thereof which extends into said passageway, said horizontal slot being positioned below said shoulders;

a tab slidably mounted in said horizontal slot for supporting the components dropped from the end of the magazine tube; said tab having a slot formed therein which extends into said passageway;

said receiver block having a lower back section, opposite said horizontal slot, terminating at a distance from the top surface of said tab, said distance being slightly greater than the thickness of one component, and said receiver block having a vertical slot in a front section thereof which is aligned with said tab slot, has a length substantially greater than the width of said tab slot, and extends into said passageway for receiving a component pick off member which is adapted to pass through the tab slot to extract a component out of said lower back section of the receiver base.

2. An apparatus as defined in claim 1 which comprises:

a support member upwardly extending from said receiver; and a pair of flexible arms projecting from said support member for receiving and gripping said tube.

3. A fixture for receiving a stack of components to be dispensed by a component extracting member, which comprises:

a receiver block having a vertical passageway therethrough with opposed shoulders projecting into the passageway;

a magazine tube for holding a supply of components, the lower end of said tube resting on said shoulders to permit the components to drop down the passageway;

said receiver block having a horizontal slot extending into said passageway, and further including a pair of protuberances that extend into said tab slot, said horizontal slot being positioned below said shoulders;

a tab slidably mounted in said horizontal slot for supporting the components dropped from the end of the magazine tube; said tab having a slot formed therein which extends into said passageway, and further being formed with a pair of nothches formed along opposed sides thereof;

said receiver block having a lower back section terminating at a distance from the top surface of said tab, said distance being slightly greater than the thickness of one component, and said receiver block having a vertical slot in a front section thereof which is aligned with said tab slot and extends into said passageway for receiving a component pick off member which is adapted to pass through the tab slot to extract a component out of said lower back section of the receiver base.

4. An apparatus for stacking electrical boxed components each having a projecting pair of parallel leads, which comprises:

a tube having an internal cross-sectional configuration conforming to the outline of the boxed component and the projecting leads, said tube having a projection extending into a bottom portion for holding a stack of components, said tube having a slot extending from one end thereof to receive a stylus-like tool for engaging the top component and holding the components in the tube when the tube is turned upside down;

a receiver having a vertical passageway therethrough, said passageway having a cross-sectional configuration conforming to the cross-sectional configuration of said tube, said receiver having a shoulder section projecting into the passageway for supporting the edge of said tube while leaving an opening for the passage of said stack of components into a lower section of the receiver, said receiver having a tab slot extending transversely into said lower section thereof, and further having a vertical slot intersecting said tab slot and having a length substantially greater than the width of said tab slot, said receiver also having a cut away section opposite to said tab slot for exiting components from the receiver, and a tab extending into the transverse tab slot for supporting the stack of components in said receiver passageway, said tab having a longitudinal slot for receiving the stylus-like tool during loading of a stack of components in the receiver.

* * * * *

UNITED STATES PATENT AND TRADEMARK OFFICE
CERTIFICATE OF CORRECTION

PATENT NO. : 4,488,662

DATED : December 18, 1984

INVENTOR(S) : W. J. Fanning

It is certified that error appears in the above—identified patent and that said Letters Patent is hereby corrected as shown below:

Column 4, line 47, "57" should read --53--.
Column 4, line 49, after the first "72," should read --72.--.

Column 7, line 3, "nothches" should read --notches--.

Signed and Sealed this

Sixteenth Day of July 1985

[SEAL]

Attest:

DONALD J. QUIGG

*Attesting Officer*  *Acting Commissioner of Patents and Trademarks*